United States Patent
Hsieh et al.

(10) Patent No.: US 10,148,919 B2
(45) Date of Patent: Dec. 4, 2018

(54) IMAGE SENSOR HAVING YELLOW FILTER UNITS

(71) Applicant: VisEra Technologies Company Limited, Hsin-Chu (TW)

(72) Inventors: Chin-Chuan Hsieh, Hsin-Chu (TW); Wu-Cheng Kuo, Hsin-Chu (TW); Wei-Ko Wang, Taoyuan (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 29 days.

(21) Appl. No.: 14/884,072

(22) Filed: Oct. 15, 2015

(65) Prior Publication Data
US 2017/0111618 A1    Apr. 20, 2017

(51) Int. Cl.
| | |
|---|---|
| *H04N 9/077* | (2006.01) |
| *G02B 3/00* | (2006.01) |
| *G02B 5/20* | (2006.01) |
| *H04N 5/33* | (2006.01) |
| *H04N 5/374* | (2011.01) |
| *H04N 9/04* | (2006.01) |
| *H01L 27/146* | (2006.01) |

(52) U.S. Cl.
CPC ........... *H04N 9/077* (2013.01); *G02B 3/005* (2013.01); *G02B 5/208* (2013.01); *H01L 27/14621* (2013.01); *H04N 5/332* (2013.01); *H04N 5/374* (2013.01); *H04N 9/045* (2013.01); *H01L 27/14627* (2013.01)

(58) Field of Classification Search
CPC ........ H04N 9/077; H04N 9/045; H04N 5/332; H04N 5/374; G02B 3/005; G02B 5/208

USPC .................................................. 348/275–280
See application file for complete search history.

(56) References Cited

U.S. PATENT DOCUMENTS

| | | | | |
|---|---|---|---|---|
| 4,513,312 A | * | 4/1985 | Takemura | H04N 9/045 348/275 |
| 5,506,618 A | * | 4/1996 | Yoneyama | H04N 9/045 348/234 |
| 6,559,886 B1 | * | 5/2003 | Miyahara | H04N 9/045 348/226.1 |

(Continued)

FOREIGN PATENT DOCUMENTS

| | | |
|---|---|---|
| JP | 2006-078766 A | 3/2006 |
| JP | 2010-003995 A | 1/2010 |

(Continued)

OTHER PUBLICATIONS

TW Office Action from corresponding Application No. 105122171 dated Jan. 12, 2017; 6 pgs.

(Continued)

*Primary Examiner* — Sinh Tran
*Assistant Examiner* — Zhenzhen Wu
(74) *Attorney, Agent, or Firm* — Muncy, Geissler, Olds & Lowe, PC (57) ABSTRACT

An image sensor includes a sensing layer for sensing a light beam and a number of pixel groups. Each of the pixel groups includes a yellow filter unit allowing a green light component and a red light component of the light beam to pass through, a green filter unit allowing the green light component of the light beam to pass through, and a blue filter unit allowing a blue light component of the light beam to pass through.

17 Claims, 8 Drawing Sheets

(56) References Cited

U.S. PATENT DOCUMENTS

| | | | | |
|---|---|---|---|---|
| 7,872,681 B2* | 1/2011 | Davidovici | ............ | G02B 5/201 348/273 |
| 8,120,680 B2* | 2/2012 | Kim | ........................ | H04N 9/045 348/276 |
| 8,780,257 B2* | 7/2014 | Gidon | ............... | H01L 27/14621 348/273 |
| 8,792,029 B2* | 7/2014 | Lee | .................. | H01L 27/14603 348/275 |
| 2007/0285540 A1* | 12/2007 | Kwon | .................... | H04N 5/332 348/272 |
| 2008/0079806 A1* | 4/2008 | Inuiya | .................... | H04N 9/045 348/65 |
| 2008/0283729 A1* | 11/2008 | Hosaka | .................. | H04N 5/332 250/208.1 |
| 2010/0128149 A1* | 5/2010 | Kim | ..................... | H04N 5/3575 348/242 |
| 2011/0085063 A1* | 4/2011 | Min | ........................ | H04N 5/332 348/280 |
| 2011/0226934 A1* | 9/2011 | Tian | .................. | H01L 27/14603 250/208.1 |
| 2016/0088265 A1* | 3/2016 | Lu | .......................... | H04N 9/045 348/280 |

FOREIGN PATENT DOCUMENTS

| | | |
|---|---|---|
| JP | 2011-091849 A | 5/2011 |
| JP | 2015-012619 A | 6/2014 |
| JP | 2014-225667 A | 12/2014 |
| TW | 201102683 A | 1/2011 |

OTHER PUBLICATIONS

JP Office Action from corresponding Application No. 2016-010637 dated Dec. 27, 2016 with translation; 23 pgs.

* cited by examiner

IMAGE SENSOR HAVING YELLOW FILTER UNITS

BACKGROUND OF THE INVENTION

Field of the Invention

The present disclosure relates to an image sensor, and in particular to an image sensor having yellow filter units.

Description of the Related Art

In general, a digital camera utilizes an image sensor to sense light and generate an image signal, and thus a picture taken by the digital camera can be generated according to the image signal.

As digital cameras continue to develop, high-quality image signals are increasingly required. The image sensors using a backside illumination (BSI) technology have light pipe structures to guide light to photodiodes. The image sensors have greater sensitivity and image quality.

Although image sensors have been generally adequate for their intended purposes, they have not been entirely satisfactory in all respects. Consequently, it is desirable to provide a solution for improving image sensors.

BRIEF SUMMARY OF THE INVENTION

The present disclosure provides an image sensor having yellow filter units for improved sensitivity and image quality.

The present disclosure provides an image sensor including a sensing layer for sensing a light beam and a number of pixel groups. Each of the pixel groups includes a yellow filter unit allowing a green light component and a red light component of the light beam to pass through, a green filter unit allowing the green light component of the light beam to pass through, and a blue filter unit allowing a blue light component of the light beam to pass through.

The present disclosure provides an image sensor including a sensing layer for sensing a light beam and a number of pixel groups. Each of the pixel groups includes a first color group, a second color group, and a third color group. The first color group includes a yellow filter unit allowing a green light component and a red light component of the light beam to pass through, and a first clear filter unit allowing the red, green and blue components of the light beam to pass through.

The second color group includes a green filter unit allowing the green light component of the light beam to pass through, and a second clear filter unit allowing the red, green and blue components of the light beam to pass through. The third color group includes a blue filter unit allowing a blue light component of the light beam to pass through, and a third clear filter unit allowing the red, green and blue components of the light beam to pass through.

The present disclosure provides an image sensor including a sensing layer for sensing a light beam and a number of pixel groups. Each of the pixel groups includes a first color group, a second color group, and a third color group. The first color group includes a yellow filter unit allowing a green light component and a red light component of the light beam to pass through, and a number of first clear filter units allowing the red, green and blue components of the light beam to pass through. The yellow filter unit and the first clear filter units are arranged in a first filter array.

The second color group includes a green filter unit allowing the green light component of the light beam to pass through, and a number of second clear filter units allowing the red, green and blue components of the light beam to pass through. The green filter unit and the second clear filter units are arranged in a second filter array.

The third color group includes a blue filter unit allowing a blue light component of the light beam to pass through, and a number of third clear filter units allowing the red, green and blue components of the light beam to pass through. The blue filter unit and the third clear filter units are arranged in a third filter array. The pixel groups do not include a red filter unit allowing the red light component of the light beam to pass through, but block the green light component and the blue light component of the light beam.

In conclusion, the red filter units in a conventional image sensor are replaced by the yellow filter units. The yellow filter units allow green and red light components of light beams to pass through, and the yellow, green, and blue filter units match the human eye's cone spectrum. Therefore, the sensitivity and the image quality of the image sensor are improved.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale or simplified for clarity of discussion; rather, these drawings are merely intended for illustration.

Figure 1:
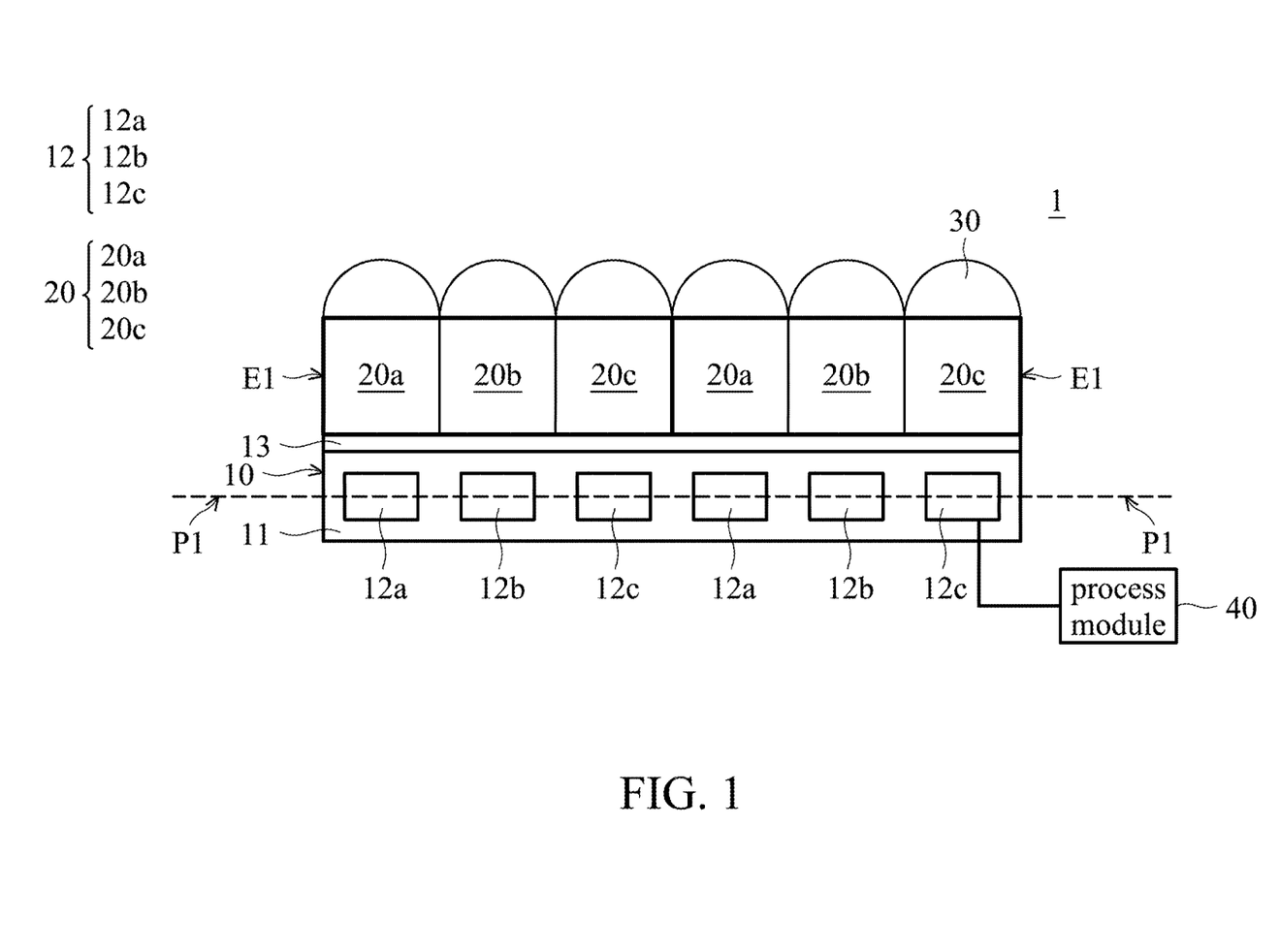
FIG. 1 is a schematic view of an image sensor in accordance with some embodiments of the present disclosure.

FIG. 1 is a schematic view of an image sensor 1 in accordance with some embodiments of the present disclosure. The image sensor 1 is configured to capture an image. The image sensor 1 can be applied to an imaging apparatus, such as a digital camera. In some embodiments, the image sensor 1 is a CMOS (Complementary Metal-Oxide-Semiconductor) sensor. In some embodiments, the image sensor 1 may be a BSI (backside illumination) CMOS sensor.

The image sensor 1 includes a sensing layer 10, filter units 20, microlenses 30, and a process module 40. The sensing layer 10 extends along a reference plane P1. The sensing layer 10 is configured to detect incident light beams according to the light beams falling on the sensing layer 10.

The sensing layer 10 may include all of the following elements, but the sensing layer 10 does not necessarily include all of the following elements, as long as the object of the sensing layer 10 is achieved. The sensing layer 10 includes a substrate 11, sensing units 12, and a passivation layer 13. In some embodiments, the sensing layer 10 further includes other optional layers (not shown in figures).

The sensing units 12 are disposed in the substrate 11. The sensing units 12 are arranged in a sensing array at the reference plane P1. In some embodiments, the sensing units 12 are photodiodes. Each of the sensing units 12 is configured to sense light beams and generate an intensity signal according to the intensity of the light beams falling thereon. An image can be generated according to the intensity signals by the process module 40.

The passivation layer 13 is disposed on the substrate 11. The passivation layer 13 is to protect circuit (not shown in figures) underneath of the sensing units 12. In some embodiments, the passivation layer 13 is parallel to the sensing layer 10.

Figure 2:
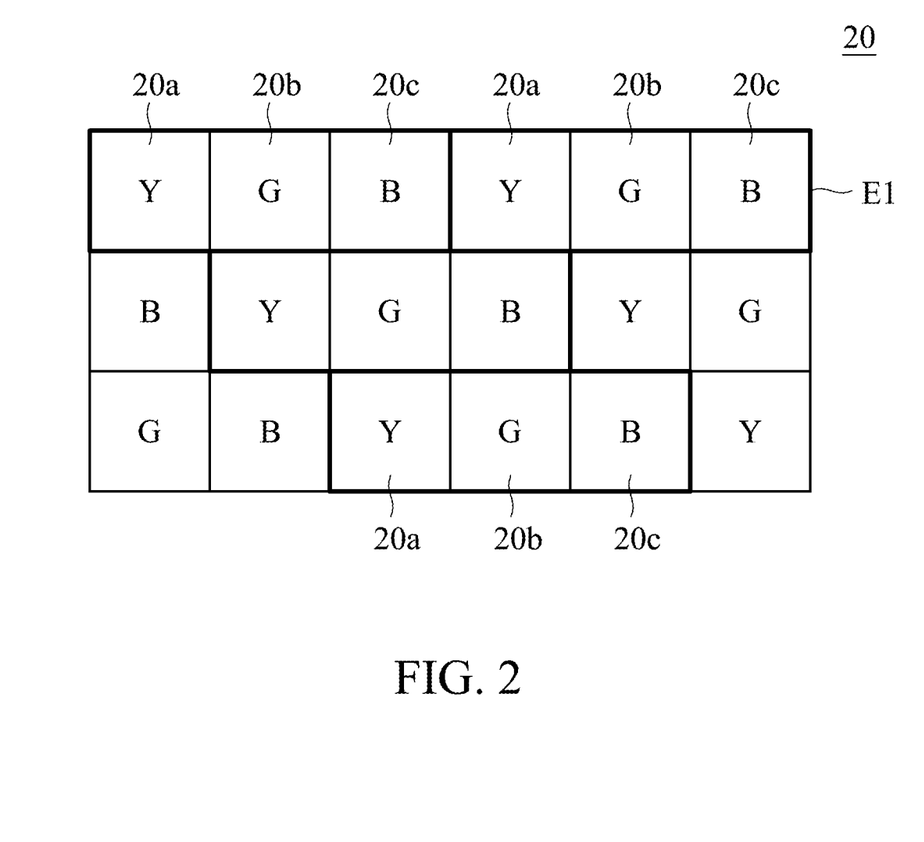
FIG. 2 is a top view of the filter units in accordance with some embodiments of the present disclosure.

FIG. 2 is a top view of the filter units 20 in accordance with some embodiments of the present disclosure. As shown in FIGS. 1 and 2, the filter units 20 are disposed on the passivation 13 of the sensing layer 10. The filter units 20 are arranged in a filter array on a plane parallel to the reference plane P1. Each of the filter units 20 is disposed over one of the sensing units 12. The filter units 20 are color filter units. Each of the filter units 20 allows a predetermined range of wavelengths of light beam to pass through.

In some embodiments, several filter units 20 belong to a pixel group E1. In other words, the pixel groups E1 are disposed over the sensing units 12, and arranged in a pixel array on a plane parallel to the reference plane P1. Each of the pixel groups E1 corresponds to one pixel of the image captured by the image sensor 1.

The number of filter units 20 included in one pixel group E1 is not limited. Fore example, the pixel group E1 includes at least two, three or four filter units 20. In this embodiment, the filter units 20 in each of the pixel groups E1 are arranged along a linear line.

The microlenses 30 are disposed on the pixel groups E1. Each of the microlenses 30 is disposed on one of the filter units 20. The microlenses 30 are arranged in a microlens array on a plane parallel to the reference plane P1. The microlenses 30 are configured to focus light beams to the sensing units 12.

The process module 40 is electrically connected to each of the sensing units 12. The process module 40 is configured to receive the intensity signals from the filter units 20.

As shown in FIG. 1, when a light beam falls on the image sensor 1, the light beam passes through the microlenses 30 and the filter units 20 to the sensing units 12. The light beam is focused by the microlenses 30. Each of the filter units 20 allows a predetermined range of wavelengths of light beam to pass. Each of the sensing units 12 generates an intensity signal according to the intensity of the light beam passing through the filter units 20 of pixel groups E1 falling thereon. The process module 40 receives the intensity signals from the sensing units 12 and generates an image according to the intensity signals.

As shown in FIGS. 1 and 2, the filter units 20 include yellow filter units 20a, green filter units 20b, and blue filter units 20c. The yellow filter units 20a, the green filter units 20b, and the blue filter units 20c are alternately arranged on the sensing layer 10.

In this embodiment, one pixel group E1 includes one yellow filter unit 20a, one green filter unit 20b, and one blue filter units 20c. The yellow filter unit 20a, the green filter unit 20b, and the blue filter unit 20c are arranged along a linear line. In some embodiments, the pixel group E1 includes at least two yellow filter units 20a, green filter units 20b, and/or blue filter units 20c.

Figure 3A:
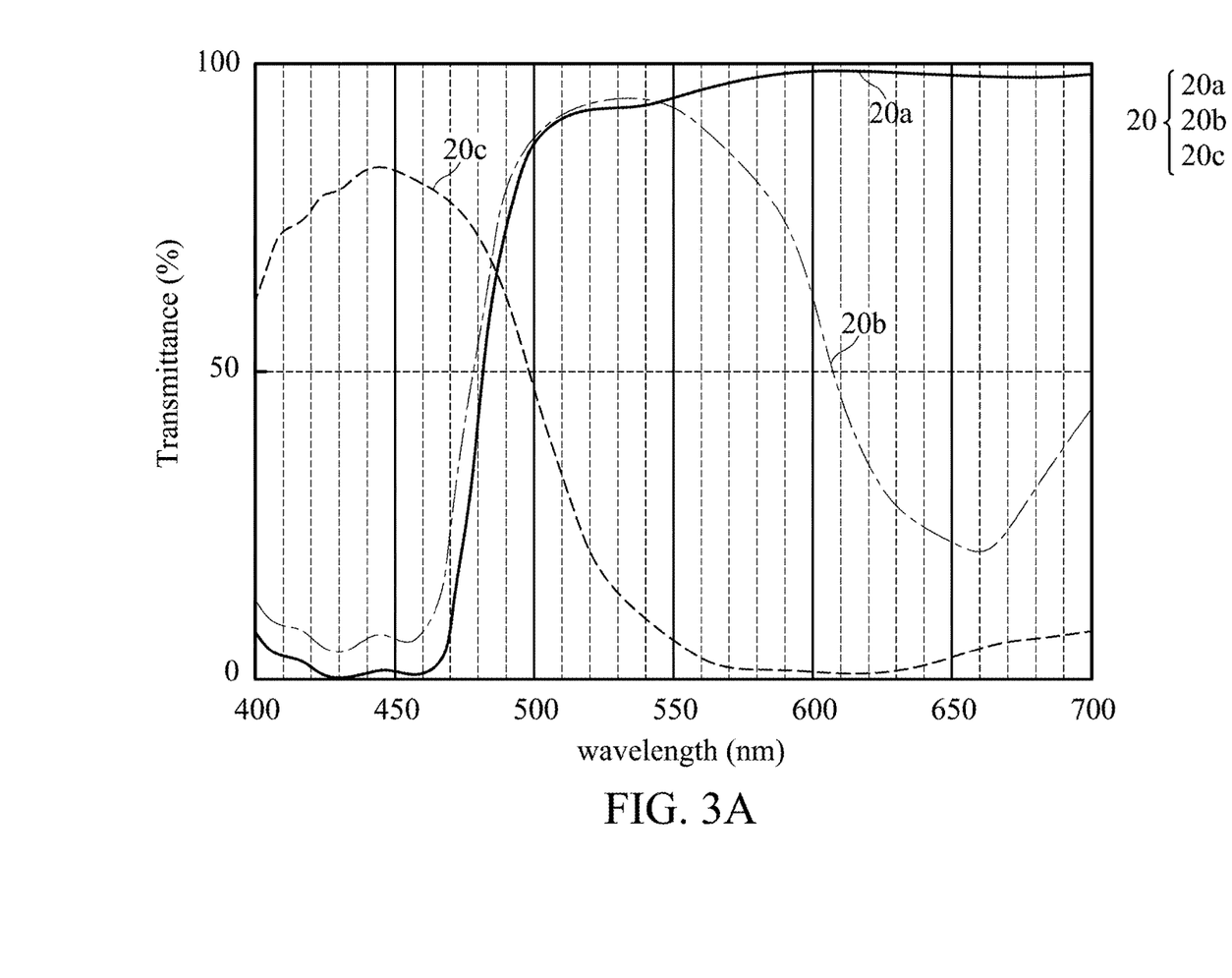
FIG. 3A is transmittance vs. wavelength diagrams of filter units in accordance with some embodiments of the present disclosure.

FIG. 3A is a transmittance vs. wavelength diagrams of filter units 20 in accordance with some embodiments of the present disclosure. The yellow filter unit 20a allows a green light component and a red light component of the light beam to pass through. In some embodiments, the yellow filter unit 20a is a high-pass filter allowing wavelengths of the light beam longer than a specific wavelength to pass through, and the specific wavelength is defined as a 50% transmittance wavelength in a range from about 470 nm to 540 nm. In other words, at least 50% of the light beam with the wavelengths longer than the specific wavelength of visible light can pass through the yellow filter unit 20a.

The green filter unit 20 allows the green light component of the light beam to pass through. In some embodiments, the green filter unit 20 is a band-pass filter allowing a green waveband of the light beam pass through. In some embodiments, the green waveband in a range from about 470 nm to about 600 nm of 50% transmittance wavelength. In other words, at least 50% of the light beam in the green waveband can pass through the green filter unit 20. A short 50% transmittance wavelength, such as 470 nm, of the green waveband is equal to or shorter than the specific wavelength of yellow filter units 20.

The blue filter unit 20 allows a blue light component of the light beam to pass through. In some embodiments, the filter units 20 and the pixel groups E1 do not include any red filter unit 20 allowing the red light component of the light beam, but block the green light component and the blue light component of the light beam.

Figure 3B:
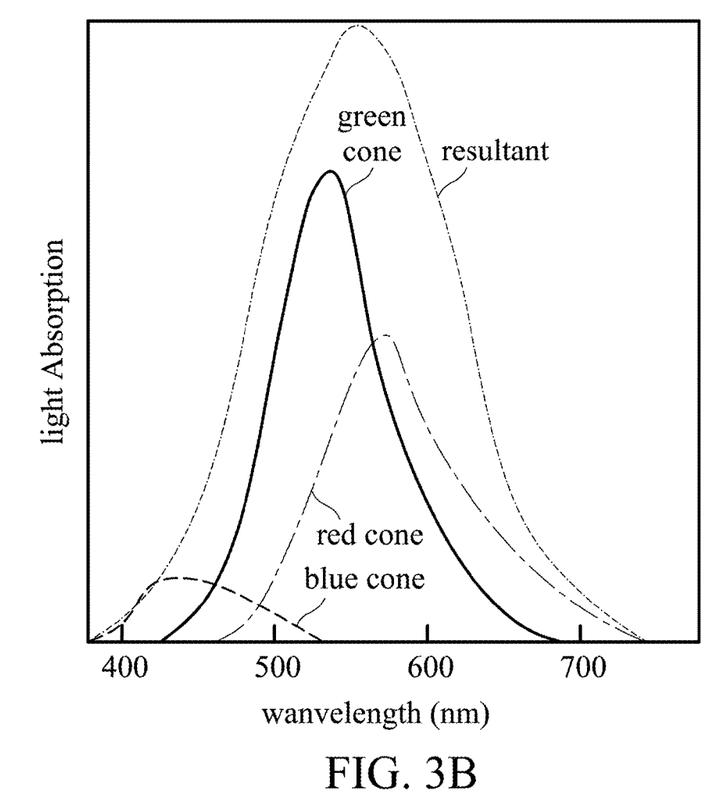
FIG. 3B is a human eye's response spectrum diagrams.

Accordingly, the yellow filter units 20a allow more of the light beam to pass than the red filter units, and so the sensitivity of the image sensor 1 is improved. Moreover, the yellow, green, and blue filter units match the human eye's cone spectrum as shown in FIG. 3B. Therefore, the sensitivity and the image quality of the image sensor are improved.

In some embodiments, the sensing units 12 include sensing units 20a, sensing units 12b, and sensing units 12c. The sensing units 12a are disposed under the yellow filter units 20a, and configured to generate yellow intensity signals according to the intensity of the light beam passing through the yellow filter units 20 falling thereon.

The sensing units 12b are disposed under the green filter units 20b, and configured to generate green intensity signals according to the intensity of the light beam passing through the green filter units 20b falling thereon.

The sensing units 12c are disposed under the blue filter units 20c, and configured to generate blue intensity signals according to the intensity of the light beam passing through the blue filter units 20c falling thereon.

The process module 40 is configured to receive the yellow intensity signal, the green intensity signal, and the blue intensity signal of each of the pixel groups E1. The process module 40 generates a yellow pixel value according the yellow intensity signal, a green pixel value according the green intensity signal, a blue pixel value according to the blue intensity signal, and a red pixel value according to the yellow intensity signal and the green intensity signal.

In some embodiments, the process module 40 generates the red pixel value by the yellow intensity value minus the green intensity value. In some embodiments, the red intensity value, the green intensity value, and the blue intensity value are integers in a range from 0 to 1023.

The red pixel value corresponds to a red color, the green pixel value corresponds to a green color, and the blue pixel value corresponds to a blue color. The process module 40 generates pixel values according to the green, blue, and red pixel values of each of the pixel groups E1. Therefore, an image can be generated according to the pixel values of the pixel groups E1 by the process module 40.

Figure 4:
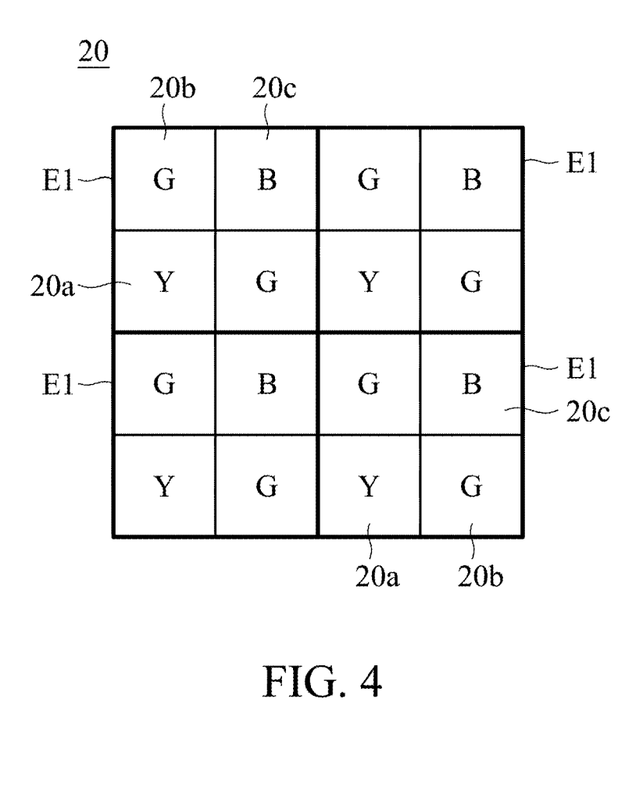
FIG. 4 is a top view of the filter units in accordance with some embodiments of the present disclosure.

FIG. 4 is a top view of the filter units 20 in accordance with some embodiments of the present disclosure. In some embodiments, the filter units 20 are arranged in an N×M array. The N and M are integers. In some embodiments, the N and M are in a range from 2 to 10. For example, the filter units 20 are arranged in a 2×2, 2×3, 2×4, 3×3, 3×4, or 4×4 array.

The pixel groups E1 are arranged in a pixel array. In this embodiment, the pixel group E1 includes four filter units 20. The filter units 20 are arranged in a 2×2 array. In some embodiments, the pixel group E1 includes two green filter units 20b, one yellow filter unit 20a and one blue filter unit 20c. The green filter units 20b are arranged at two opposite corners of the pixel group E1. The yellow filter unit 20a and the blue filter unit 20c are arranged at other opposite corners of the pixel group E1.

Since the human eye is sensitive to the color green, the number of green filter units 20b is greater than the number of yellow filter units 20a and/or the number of blue filter units 20c. Therefore, the green colors of the image generated by the image sensor 1 have more details, and the image quality of the image sensor 1 is improved.

Figure 5:
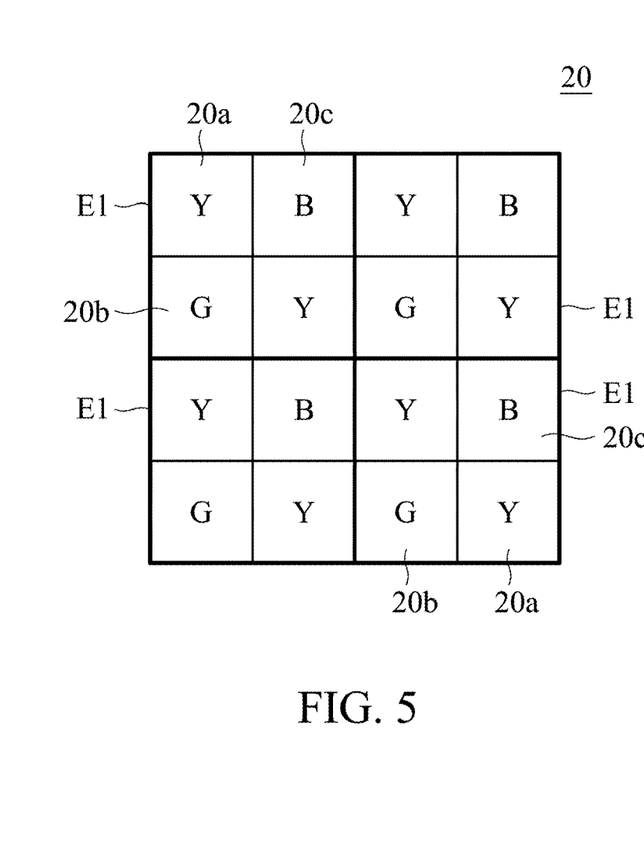
FIG. 5 is a top view of the filter units in accordance with some embodiments of the present disclosure.

FIG. 5 is a top view of the filter units 20 in accordance with some embodiments of the present disclosure. In this embodiment, the pixel group E1 includes two yellow filter units 20a. The yellow filter units 20a are arranged at two opposite corners of the pixel group E1, and the green filter unit 20b and the blue filter unit 20c are arranged at other opposite corners of the pixel group E1.

Accordingly, the red and green colors of the image are improved since the number of yellow filter units 20a is greater than the number of green filter units 20b and/or the number of blue filter units 20c.

Figure 6:
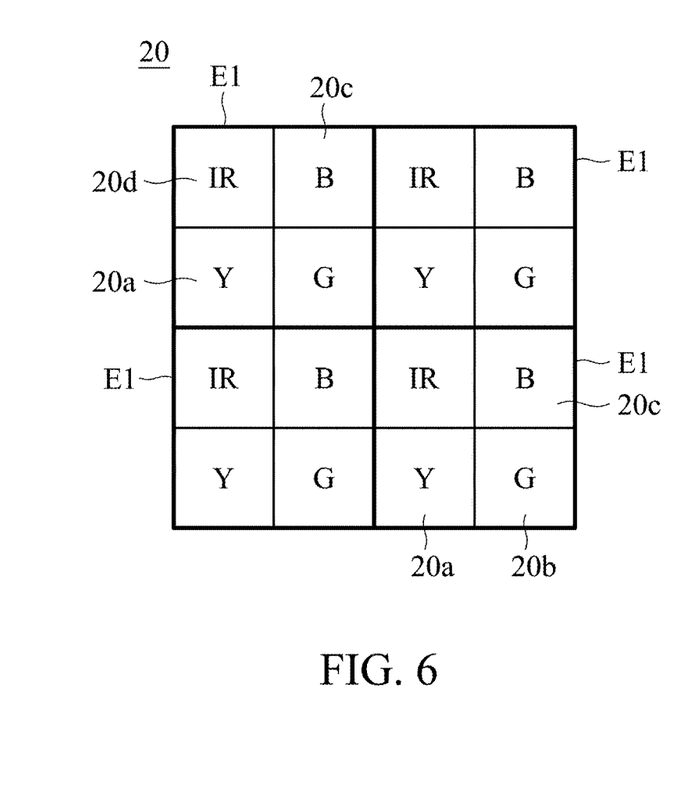
FIG. 6 is a top view of the filter units in accordance with some embodiments of the present disclosure.

FIG. 6 is a top view of the filter units 20 in accordance with some embodiments of the present disclosure. In some embodiments, each of the pixel groups E1 further includes one or more enhancing filter units 20. In this embodiment, the enhancing filter unit 20d allows an infrared ray component of the light beam to pass through. The yellow filter unit 20a, the green filter unit 20b, the blue filter unit 20c, and the enhancing filter unit 20d are arranged in a filter array.

Therefore, the image sensor 1 can be a spectrum-inspection device. The infrared ray can be displayed in the image by the enhancing filter units 20d.

Figure 7:
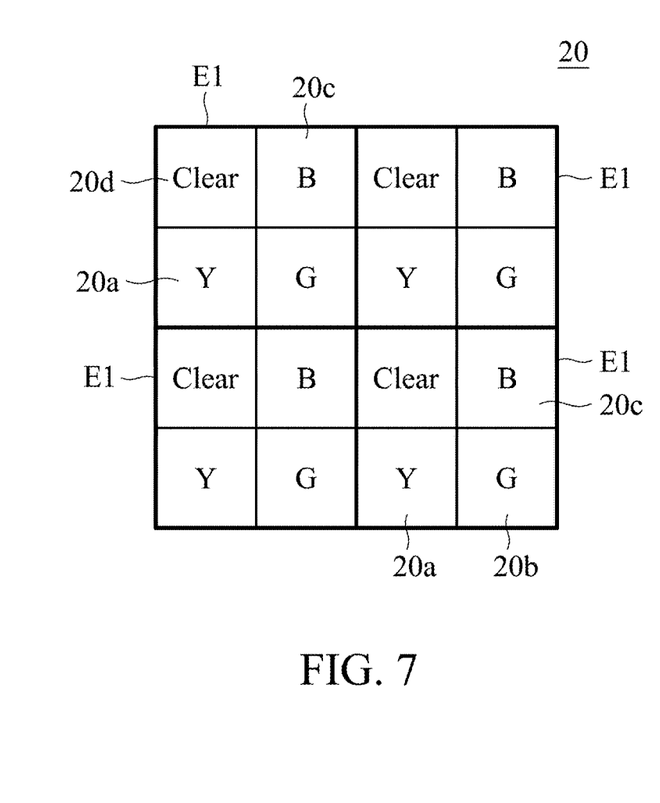
FIG. 7 is a top view of the filter units in accordance with some embodiments of the present disclosure.

FIG. 7 is a top view of the filter units 20 in accordance with some embodiments of the present disclosure. In some embodiments, the enhancing filter unit 20d is a clear filter unit. In some embodiments, the clear filter unit 20d is made from a transparent material, such as organic transparent materials or transparent photoresists. The clear filter unit 20d allows the light beam to pass through. In some embodiments, the clear filter unit 20d does not filter the light beam.

Since the red, green, and blue components of the light beam can pass through the clear filter unit 20d, the quantity of the of light beam sensed by the sensing unit 12, which under the clear filter unit 20d, is increased. Moreover, the sensitivity of the sensing unit 12, which under the clear filter unit 20d, is increased. Therefore, the intensity of the yellow, green and blue intensity signals relative to the yellow, green, blue filter units 20a, 20b and 20c can be adjusted by the process module 40 (as shown in FIG. 1) according to the intensity signals relative to the clear filter unit 20d. Therefore, the sensitivity of the image sensor is improved.

Figure 8:
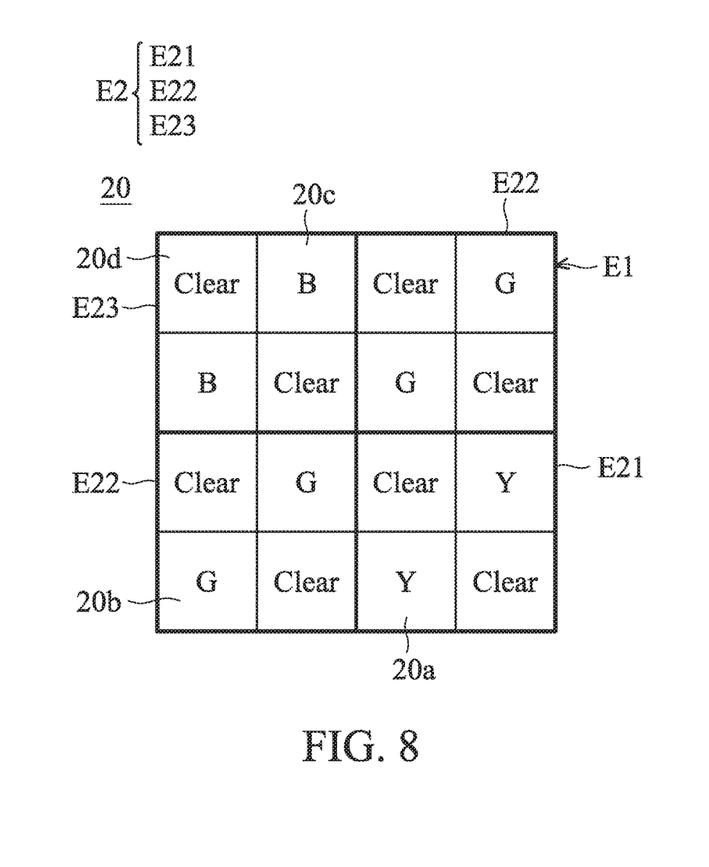
FIG. 8 is a top view of the filter units in accordance with some embodiments of the present disclosure.

FIG. 8 is a top view of the filter units 20 in accordance with some embodiments of the present disclosure. In FIG. 8, there is only one pixel group E1 is illustrated for clarity. Each of the pixel groups E1 includes color groups E2. In some embodiments, the color groups E2 are arranged in a color array. In this embodiment, the color array is a 2×2 array.

The color group E2 includes the color groups E21, E22 and E23. The color group E21 includes at least one yellow filter unit 20a and at least one clear filter unit 20d. In this embodiment, the color group E21 includes two yellow filter units 20a and two clear filter units 20 arranged in a 2×2 array. Therefore, the sensitivity of the image sensor 1 relative to the yellow components of the light beam is improved.

The color group E22 includes at least one green filter unit 20b and at least one clear filter unit 20d. In this embodiment, the color group E22 includes two green filter units 20b and two clear filter units 20 arranged in a 2×2 array. Therefore, the sensitivity of the image sensor 1 relative to the green components of the light beam is improved. In addition, since the pixel group E1 includes at least two color groups E22, the sensitivity of the image sensor 1 to the green components is further improved.

The color group E23 includes at least one blue filter unit 20c and at least one clear filter unit 20d. In this embodiment, the color group E23 includes two blue filter units 20 and two clear filter units 20 arranged in a 2×2 array. Therefore, the sensitivity of the image sensor 1 relative to the blue components of the light beam is improved.

Figure 9:
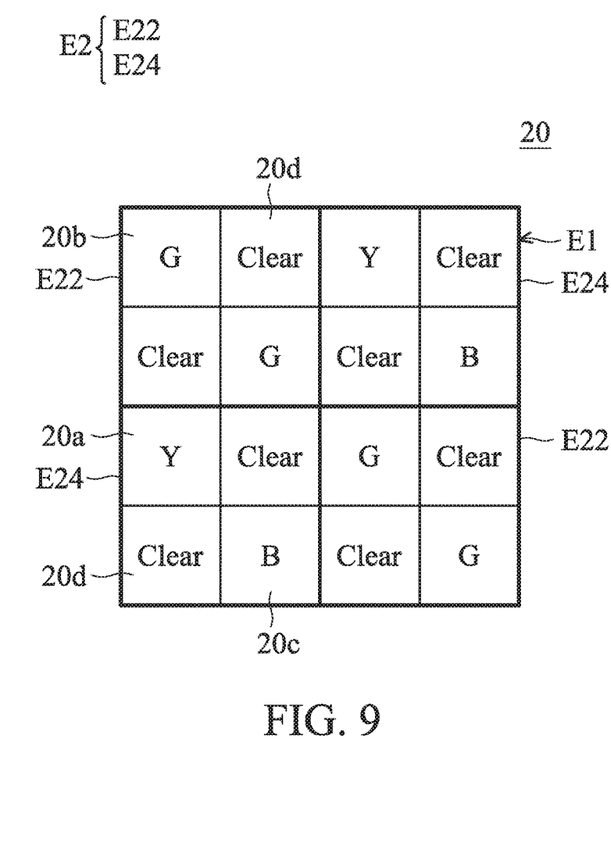
FIG. 9 is a top view of the filter units in accordance with some embodiments of the present disclosure.

FIG. 9 is a top view of the filter units 20 in accordance with some embodiments of the present disclosure. The color group E2 includes color groups E22 and E24. The color group E24 includes at least one yellow filter unit 20a, at least one blue filter unit 20c and at least two clear filter units 20d. In this embodiment, the color group E24 includes one yellow filter unit 20a, one blue filter unit 20c and two clear filter units 20d.

Figure 10:
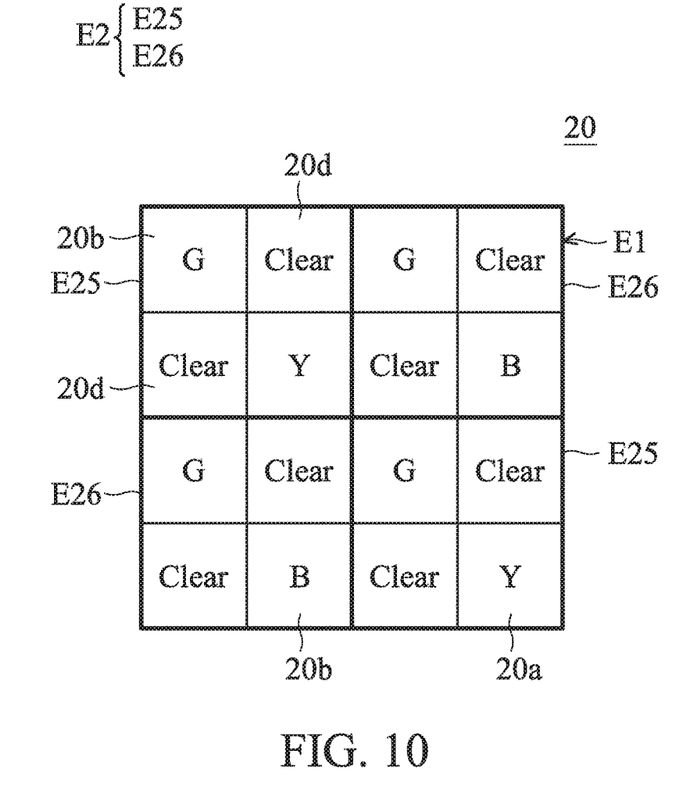
FIG. 10 is a top view of the filter units in accordance with some embodiments of the present disclosure.

FIG. 10 is a top view of the filter units 20 in accordance with some embodiments of the present disclosure. The color group E2 includes color groups E25 and E26. The color group E25 includes at least one yellow filter unit 20a, at least one green filter unit 20b and at least one clear filter unit 20d.

In this embodiment, the color group E25 includes one yellow filter unit 20a, one green filter unit 20b and two clear filter units 20d.

The color group E26 includes at least one blue filter unit 20c, at least one green filter unit 20b and at least one clear filter unit 20d. In this embodiment, the color group E25 includes one blue filter unit 20c, one green filter unit 20b and two clear filter units 20.

In conclusion, the red filter units in a conventional image sensor are replaced by the yellow filter units. The yellow filter units allow green and red light components of light beams to pass through, and the yellow, green, and blue filter units match the human eye's cone spectrum. Therefore, the sensitivity and the image quality of the image sensor are improved.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
    a sensing layer for sensing a light beam, the sensing layer comprising:
    a substrate;
    a plurality of sensing units, configured to generate intensity signals according to intensity of the light beam falling thereon, embedded in the substrate in an array; and
    a passivation layer disposed on the substrate; and
    a plurality of pixel groups disposed on the passivation layer, wherein each of the pixel groups comprises:
    a yellow filter unit allowing a green light component and a red light component of the light beam to pass through,
    a green filter unit allowing the green light component of the light beam to pass through; and
    a blue filter unit allowing a blue light component of the light beam to pass through,
    wherein each of the filter units is disposed over one of the plurality of sensing units; and
    wherein the yellow filter unit is a high-pass filter allowing wavelengths of the light beam longer than a specific wavelength to pass through, and the specific wavelength is defined as a 50% transmittance wavelength in a range from about 470 nm to 540 nm.

2. The image sensor as claimed in claim 1, wherein the pixel groups do not include a red filter unit allowing the red light component of the light beam to pass through, but block the green light component and the blue light component of the light beam.

3. The image sensor as claimed in claim 1, wherein the yellow filter unit, the green filter unit, and the blue filter unit are arranged along a linear line.

4. The image sensor as claimed in claim 1, wherein each of the pixel groups further comprises an enhancing filter unit, and the yellow filter unit, the green filter unit, the blue filter unit, and the enhancing filter unit are arranged in a filter array.

5. The image sensor as claimed in claim 4, wherein the enhancing filter unit allows an infrared ray component of the light beam to pass through.

6. The image sensor as claimed in claim 4, wherein the enhancing filter unit is a clear filter unit allowing the red light component, the green light component and the blue light component of the light beam to pass through.

7. The image sensor as claimed in claim 1, wherein the green filter unit is a band-pass filter allowing a green waveband of the light beam pass through, and a short 50% transmittance wavelength of the green waveband is equal to or shorter than the specific wavelength of yellow filter unit.

8. The image sensor as claimed in claim 1, wherein the plurality of sensing units comprises:
    a first sensing unit disposed under the yellow filter unit, and configured to generate a yellow intensity signal according to the intensity of the light beam passing through the yellow filter unit falling thereon; and
    a second sensing unit disposed under the green filter unit, and configured to generate a green intensity signal according to the intensity of the light beam passing through the green filter unit falling thereon;
    wherein a red pixel value is generated according to the yellow intensity signal and the green intensity signal.

9. The image sensor as claimed in claim 1, further comprising a plurality of microlenses respectively disposed on one of the yellow, the green, and the blue filter units.

10. The image sensor as claimed in claim 1, further comprising a plurality of microlenses disposed on the pixel groups.

11. An image sensor, comprising:
    a sensing layer for sensing a light beam, the sensing layer comprising:
    a substrate;
    a plurality of sensing units, configured to generate intensity signals according to intensity of the light beam falling thereon, embedded in the substrate in an array: and
    a passivation layer disposed on the substrate; and
    a plurality of pixel groups disposed on the passivation layer, wherein each of the pixel groups comprises:
    a first color group comprising a yellow filter unit allowing a green light component and a red light component of the light beam to pass through, and a first clear filter unit allowing the red light component, the green light component and a blue light component of the light beam to pass through,
    a second color group comprising a green filter unit allowing the green light component of the light beam to pass through, and a second clear filter unit allowing the red light component, the green light component and the blue light component of the light beam to pass through; and
    a third color group comprising a blue filter unit allowing the blue light component of the light beam to pass through, and a third clear filter unit allowing the red light component, the green light component and the blue light component of the light beam to pass through,
    wherein each of the filter units is disposed over one of the plurality of sensing units; and
    wherein the yellow filter unit is a high-pass filter allowing wavelengths of the light beam longer than a specific wavelength to pass through, and the specific wavelength is defined as a 50% transmittance wavelength in a range from about 470 nm to 540 nm.

12. The image sensor as claimed in claim 11, wherein the pixel groups do not include a red filter unit allowing the red light component of the light beam to pass through, but block the green light component and the blue light component of the light beam.

13. The image sensor as claimed in claim 11, wherein the first color group, the second color group and the third color group of each of the pixel groups are arranged in a color array.

14. The image sensor as claimed in claim 11, further comprising a plurality of microlenses disposed on the pixel groups.

15. An image sensor, comprising:
a sensing layer for sensing a light beam, the sensing layer comprising:
a substrate;
a plurality of sensing units, configured to generate intensity signals according to intensity of the light beam falling thereon, embedded in the substrate in an array; and
a passivation layer disposed on the substrate;
a plurality of pixel groups arranged in a pixel array on the passivation layer, wherein each of the pixel groups comprises:
a first color group comprising a yellow filter unit allowing a green light component and a red light component of the light beam to pass through, and a plurality of first clear filter units allowing the red light component, the green light component and a blue light component of the light beam to pass through, wherein the yellow filter unit and the first clear filter units are arranged in a first filter array;
a second color group comprising a green filter unit allowing the green light component of the light beam to pass through, and a plurality of second clear filter units allowing the red light component, the green light component and the blue light component of the light beam to pass through, wherein the green filter unit and the second clear filter units are arranged in a second filter array; and
a third color group comprising a blue filter unit allowing a blue light component of the light beam to pass through, and a plurality of third clear filter units allowing the red light component, the green light component and the blue light component of the light beam to pass through, wherein the blue filter unit and the third clear filter units are arranged in a third filter array,
wherein the pixel groups do not include a red filter unit allowing the red light component of the light beam to pass through, but block the green light component and the blue light component of the light beam, and
wherein each of the filter units is disposed over one of the plurality of sensing units; and
wherein the yellow filter unit is a high-pass filter allowing wavelengths of the light beam longer than a specific wavelength to pass through, and the specific wavelength is defined as a 50% transmittance wavelength in a range from about 470 nm to 540 nm.

16. The image sensor as claimed in claim 15, wherein the first color group, the second color group and the third color group of each of the pixel groups are arranged in a color array.

17. The image sensor as claimed in claim 15, further comprising a plurality of microlenses disposed on the pixel groups.

* * * * *